(12) United States Patent
Horita et al.

(10) Patent No.: US 12,406,861 B2
(45) Date of Patent: Sep. 2, 2025

(54) METHOD OF PLACING PROTECTIVE MEMBER ON WORKPIECE

(71) Applicant: DISCO CORPORATION, Tokyo (JP)

(72) Inventors: Hideji Horita, Tokyo (JP); Norihisa Arifuku, Tokyo (JP); Masamitsu Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 427 days.

(21) Appl. No.: 18/061,051

(22) Filed: Dec. 2, 2022

(65) Prior Publication Data

US 2023/0187226 A1 Jun. 15, 2023

(30) Foreign Application Priority Data

Dec. 9, 2021 (JP) ................. 2021-199974

(51) Int. Cl.
*H01L 21/56* (2006.01)
*B29C 51/00* (2006.01)
*B29C 51/42* (2006.01)
*H01L 21/683* (2006.01)

(52) U.S. Cl.
CPC .......... *H01L 21/566* (2013.01); *B29C 51/002* (2013.01); *B29C 51/428* (2013.01); *H01L 21/6835* (2013.01); *H01L 2221/68363* (2013.01)

(58) Field of Classification Search
CPC ............... H01L 21/566; H01L 21/6835; H01L 2221/68363; H01L 2221/6832; H01L 2221/68386; H01L 21/6836; H01L 21/67132; H01L 21/56; B29C 51/002; B29C 51/428; B29C 55/16; B29C 63/02

USPC .......................................................... 257/782
See application file for complete search history.

(56) References Cited

U.S. PATENT DOCUMENTS

| | | | |
|---|---|---|---|
| 6,682,676 B1* | 1/2004 | Renault | B29C 51/145 264/161 |
| 9,397,321 B2* | 7/2016 | Kaibin | B32B 7/12 |
| 9,522,488 B2* | 12/2016 | Lee | B29C 55/08 |
| 9,900,988 B1* | 2/2018 | Chao | H05K 3/284 |
| 10,889,422 B2* | 1/2021 | Jasso | B65B 51/02 |
| 11,524,444 B2* | 12/2022 | Liperoti | B65D 75/32 |
| 11,724,840 B2* | 8/2023 | Watanabe | B65B 51/14 53/453 |
| 11,780,188 B2* | 10/2023 | Hirabayashi | B29B 11/12 264/571 |
| 11,897,680 B2* | 2/2024 | Van Den Broek | B65D 81/261 |
| 2013/0206329 A1* | 8/2013 | Tutmark | A63B 37/0023 156/227 |
| 2015/0008619 A1* | 1/2015 | Maertiens | B29C 70/541 264/319 |

(Continued)

FOREIGN PATENT DOCUMENTS

| | | |
|---|---|---|
| JP | 2013021017 A | 1/2013 |
| JP | 2021082631 A | 5/2021 |

*Primary Examiner* — Vu A Vu
(74) *Attorney, Agent, or Firm* — Greer Burns & Crain Ltd.

(57) ABSTRACT

A method of placing a protective member on a workpiece includes a sheet producing step of heating a plate-shaped thermoplastic resin to soften or melt the same while gripping and pulling outer edges of the thermoplastic resin in at least four directions to produce a sheet-like protective member, and after the sheet producing step, an integrating step of heating and bringing the sheet-like protective member into intimate contact with the workpiece to integrate the workpiece and the protective member with each other.

9 Claims, 13 Drawing Sheets

(56) References Cited

U.S. PATENT DOCUMENTS

2019/0016039 A1* 1/2019 Drees ............... B29C 70/44
2022/0227949 A1* 7/2022 Allen ............... B29C 48/914

* cited by examiner

METHOD OF PLACING PROTECTIVE MEMBER ON WORKPIECE

BACKGROUND OF THE INVENTION

Field of the Invention

The present invention relates to a method of placing a protective member on a workpiece.

Description of the Related Art

When a plate-shaped workpiece such as a semiconductor wafer is thinned down by grinding or divided by a cutting blade or a laser beam applied thereto, the workpiece is held on a chuck table. If the workpiece is directly put on the chuck table, the workpiece tends to be damaged or contaminated, or pieces into which the workpiece has been divided cannot be delivered all together. Therefore, it has been general practice to affix an adhesive tape to a surface of the workpiece that is to contact a holding surface of the chuck table (see, for example, JP 2013-021017A).

However, when the adhesive tape is peeled off from the workpiece, adhesive residuals from the adhesive tape may remain on the workpiece. In view of the shortcoming, there has been proposed a process of supplying a support surface of a flat support table with lump, string, granular, or flowable thermoplastic resin, heating and spreading the thermoplastic resin into a sheet-like protective member, and bonding the sheet-like protective member to the workpiece (see, for example, JP 2021-082631A).

SUMMARY OF THE INVENTION

The protective member produced by the process disclosed in JP 2021-082631A is advantageous in that, since the protective member can be bonded to the workpiece by heating without the need for an adhesive layer, no residuals are left on the workpiece when the protective member is peeled off from the workpiece. However, the protective member is problematic in that it is tedious and time-consuming to peel off the protective member from the support table and that the protective member is liable to have thickness inaccuracies because a member used to press the thermoplastic resin against the support table is likely to expand with heat.

It is therefore an object of the present invention to provide a method of placing a protective member while making it less tedious and time-consuming to peel off the protective member from a support table and reducing the adverse effect of heat from a pressing member on the protective member.

In accordance with an aspect of the present invention, there is provided a method of placing a protective member on a workpiece, including a sheet producing step of heating a plate-shaped thermoplastic resin to soften or melt the plate-shaped thermoplastic resin while gripping and pulling outer edges of the thermoplastic resin in at least four directions to produce a sheet-like protective member, and after the sheet producing step, an integrating step of heating and bringing the sheet-like protective member into intimate contact with the workpiece to integrate the workpiece and the protective member with each other.

Preferably, the sheet producing step includes a step of adjusting a thickness of the protective member by controlling a pulled distance by which the outer edges of the thermoplastic resin are pulled.

According to the present invention, it is less tedious and time-consuming to peel off the protective member from a support table, and the adverse effect of heat from a pressing member on the protective member is reduced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
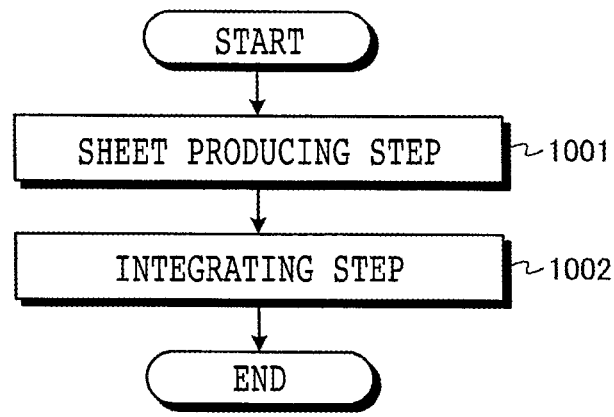
FIG. 1 is a flowchart of a processing sequence of a method of placing a protective member according to an embodiment of the present invention.

A preferred embodiment of the present invention will be described in detail hereinbelow with reference to the accompanying drawings. The present invention is not limited to the details of the embodiment described below. The components described below cover those which could easily be anticipated by those skilled in the art and those which are essentially identical to those described above. Further, the arrangements described below can be combined in appropriate manners. Various omissions, replacements, or changes of the arrangements may be made without departing from the scope of the present invention. In the description below, those components that are identical to each other are denoted by identical reference characters.

A method of placing a protective member according to the present embodiment will be described below with reference to the drawings. FIG. 1 is a flowchart of a processing sequence of the method of placing a protective member according to the present embodiment. The method of placing a protective member according to the present embodiment is a method of placing a protective member 110 (see FIGS. 13, 14, etc.) on one surface of a workpiece 1 illustrated in FIG. 2 or a workpiece 1-2 illustrated in FIGS. 3 and 4. As illustrated in FIG. 1, the method includes a sheet producing step 1001 and an integrating step 1002.

Figure 2:
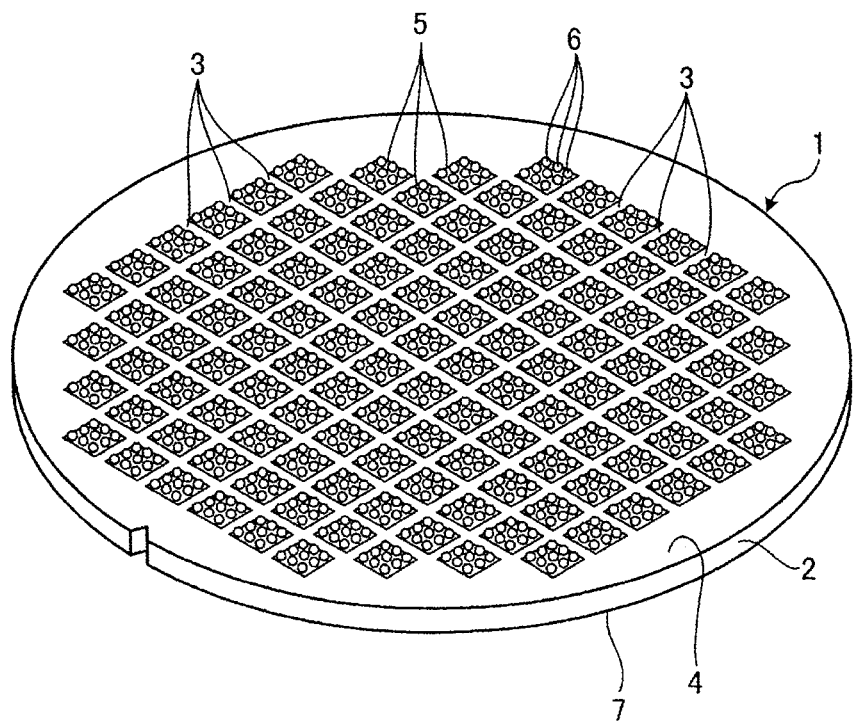
FIG. 2 is a perspective view illustrating an example of a workpiece on which to place a protective member in the method according to the embodiment.

FIG. 2 illustrates, in perspective, the workpiece 1 as an example of a workpiece on which to place the protective member 110 in the method of placing a protective member according to the present embodiment. According to the present embodiment, the workpiece 1 includes a wafer such as a semiconductor wafer or an optical device wafer in the form of a circular plate and includes a substrate 2 made of silicon, sapphire, gallium arsenide, silicon carbide (SiC), gallium nitride (GaN), lithium tantalate (LT), monocrystalline diamond, or the like. According to the present invention, the workpiece 1 is not limited, in shape, to a circular plate, but may include a different plate-shaped object such as a resin-encapsulated substrate or a metal substrate.

According to the present embodiment, as illustrated in FIG. 2, the workpiece 1 has a plurality of chip-shaped devices 5 constructed in respective areas demarcated on a face side 4 by a grid of perpendicularly intersecting projected dicing lines 3 established thereon. The workpiece 1 will be divided into individual devices, i.e., device chips, 5 along the projected dicing lines 3. According to the present invention, the workpiece is not limited to the illustrated workpiece 1, but may be free of devices 5. According to the present embodiment, the workpiece 1 has a plurality of electrode bumps 6 disposed on and protruding from face sides 4 of the devices 5. The workpiece 1 and the devices 5 have structural protrusions or surface irregularities provided by the bumps 6 on the face side or sides 4. According to the present invention, however, the workpiece 1 and the devices 5 may be free of bumps 6 or structural protrusions on the face side 4. According to the present embodiment, the workpiece 1 and the devices 5 has a flat reverse side 7 opposite the face side 4. According to the present invention, the reverse side 7 may not be flat, but the workpiece 1 may have structural protrusions or surface irregularities on the reverse side 7.

Figure 3:
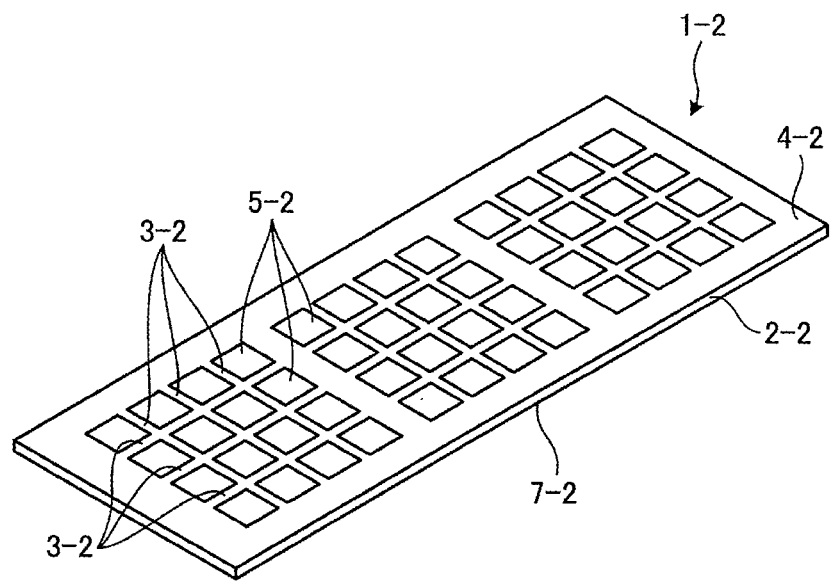
FIG. 3 is a perspective view illustrating another example of the workpiece on which to place a protective member in the method according to the embodiment.
Figure 4:
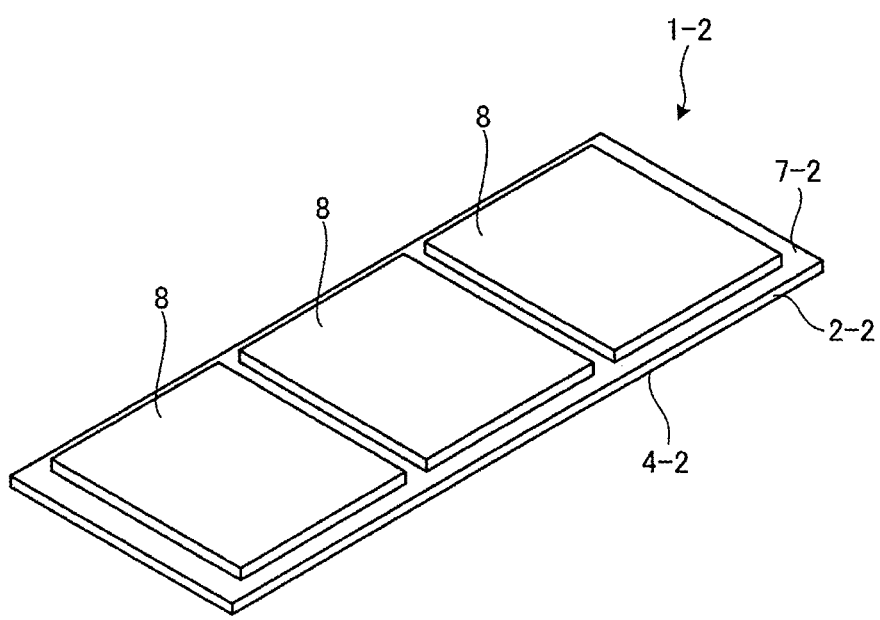
FIG. 4 is another perspective view of the other example of workpiece illustrated in FIG. 3.

FIG. 3 illustrates, in perspective, a workpiece 1-2 as another example of a workpiece on which to place the protective member 110 in the method according to the embodiment. FIG. 4 is another perspective view of the workpiece 1-2 illustrated in FIG. 3. FIG. 3 illustrates the workpiece 1-2 as viewed from a face side 4-2 thereof, whereas FIG. 4 illustrates the workpiece 1-2 as viewed from a reverse side 7-2 thereof.

According to the present embodiment, the workpiece 1-2 includes a packaged substrate including a wiring substrate 2-2 that has an insulative plate and a ground line made of an electrically conductive metal embedded in the insulative plate, with electrodes and various kinds of wiring disposed on the face side 4-2 and the reverse side 7-2. As illustrated in FIG. 3, the workpiece 1-2 has a plurality of devices 5-2 constructed in respective areas demarcated on the face side 4-2 by a grid of perpendicularly intersecting projected dicing lines 3-2 established thereon. The workpiece 1-2 also includes encapsulant pads 8 (see FIG. 4) disposed on the reverse side 7-2 of the wiring substrate 2-2 to encapsulate the devices 5-2 and wires, not illustrated, produced by wire bonding on the devices 5-2. The encapsulant pads 8 are made of a molded resin such as epoxy resin, silicone resin, urethane resin, unsaturated polyester resin, acrylic urethane resin, or polyimide resin. The workpiece 1-2 has structural protrusions or surface irregularities provided by the devices 5-2 on the face side 4-2 and the encapsulant pads 8 on the reverse side 7-2. The workpiece 1-2 will be divided into individual devices, i.e., device chips, 5-2 along the projected dicing lines 3-2.

The method of placing a protective member according to the present embodiment places a sheet-like protective member 110 (see FIG. 5) on the face side 4 of the workpiece 1, which is one of the surfaces of the workpiece 1 as a holdable surface thereof, by bringing the protective member 110 into intimate contact with the face side 4 of the workpiece 1 and integrating the protective member 110 with the face side 4. According to the present invention, the method of placing a protective member is not limited to such details, but may be changed or modified. For example, the protective member 110 may be placed on the reverse side 7 of the workpiece 1, and the protective member 110 may be placed on the face side 4-2 or the reverse side 7-2 of the workpiece 1-2. The holdable surface referred to above refers to a surface of the workpieces 1 and 1-2 and the devices 5 and 5-2 that is held under suction on chuck tables 72, 82, and 92 (see FIGS. 19, 20, and 21) when the workpieces 1 and 1-2 on which the protective member 110 has been placed by the method of placing a protective member are processed.

Figure 5:
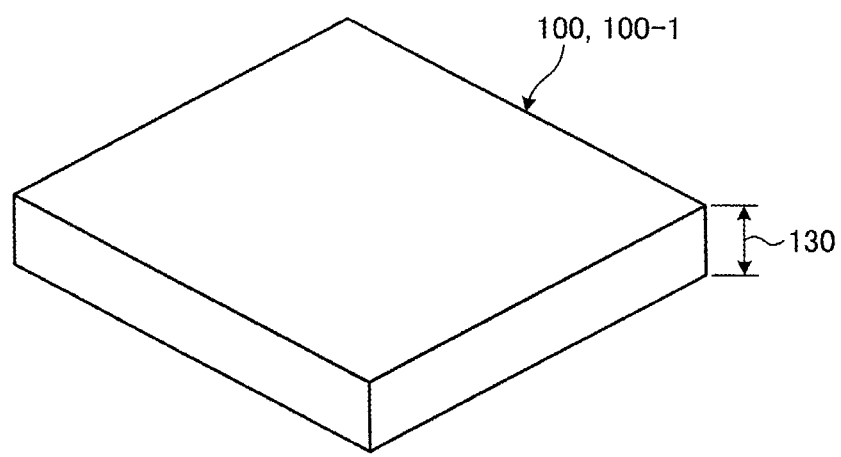
FIG. 5 is a perspective view illustrating an example of thermoplastic resin used in a sheet producing step illustrated in FIG. 1.
Figure 6:
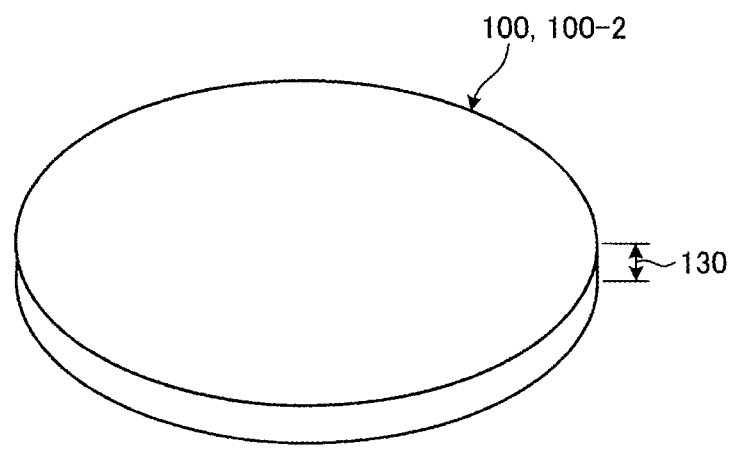
FIG. 6 is a perspective view illustrating another example of thermoplastic resin used in the sheet producing step illustrated in FIG. 1.

FIG. 5 illustrates, in perspective, a thermoplastic resin block 100-1 as an example of thermoplastic resin used in the sheet producing step 1001 illustrated in FIG. 1. FIG. 6 illustrates, in perspective, a thermoplastic resin block 100-2 as another example of thermoplastic resin used in the sheet producing step 1001 illustrated in FIG. 1. As illustrated in FIG. 5, the thermoplastic resin block 100-1 includes a square plate in the form of a mass of thermoplastic resin. As illustrated in FIG. 6, the thermoplastic resin block 100-2 includes a circular plate in the form of a mass of thermoplastic resin. In the present description, the thermoplastic resin blocks 100-1 and 100-2 will collectively be referred to as a "thermoplastic resin block 100" wherever there is no need to distinguish between them. The thermoplastic resin block 100 is shaped as a plate having a uniform thickness 130 within a predetermined allowable range. According to the present invention, the thermoplastic resin block 100 is not limited to the square or circular plate, but may be of any shape as viewed in plan, providing it is plate-shaped.

According to the present embodiment, the thermoplastic resin that the thermoplastic resin block 100 is made of is in the form of a rigid body that is not flowable in a hardened state at temperatures lower than its softening point. At those temperatures, since the thermoplastic resin does not essentially have adhesiveness unlike an adhesive, it is prevented from sticking excessively to the one surface of the workpiece 1 compared with an adhesive tape having an adhesive layer made of an adhesive or the like. In addition, in a softened state at temperatures higher than the softening point, the thermoplastic resin of the thermoplastic resin block 100 does not generally exhibit adhesiveness unlike an adhesive though it is flowable. At those temperatures, consequently, the thermoplastic resin is prevented from sticking excessively to the one surface of the workpiece 1 compared with an adhesive tape having an adhesive layer made of an adhesive or the like.

The thermoplastic resin of the thermoplastic resin block 100 specifically includes one or two or more selected from acrylic resin, methacrylic resin, vinyl-based resin, polyacetal, natural rubber, butyl rubber, isoprene rubber, chloroprene rubber, polyethylene, polypropylene, polyolefin such as poly(4-methyl-1-pentene) or poly(1-butene), polyester such as polyethylene terephthalate or polybutylene terephthalate, polyamide such as nylon-6, nylon-66, or polymethaxylene adipamide, polyacrylate, polymethacrylate, polyvinyl chloride, polyetherimide, polyacrylonitrile, polycarbonate, polystyrene, polysulfone, polyethersulfone, polyphenylene, ether polybutadiene resin, polycarbonate resin, thermoplastic polyimide resin, thermoplastic polyurethane resin, phenoxy resin, polyamide-imide resin, fluororesin, ethylene-unsaturated carboxylic acid copolymer resin, ethylene-vinyl acetate copolymer resin, ionomer, ethylene-vinyl acetate-maleic anhydride ternary copolymer resin, saponified ethylene-vinyl acetate copolymer resin, ethylene-vinyl alcohol copolymer resin, and the like.

The unsaturated carboxylic acid of the ethylene-unsaturated carboxylic acid copolymer that may be used as the thermoplastic resin of the thermoplastic resin block 100 includes, by way of example, acrylic acid, methacrylic acid, maleic acid, itaconic acid, monomethyl maleate, monoethyl maleate, maleic anhydride, itaconic anhydride, or the like. The ethylene-unsaturated carboxylic acid copolymer includes not only a binary copolymer of ethylene and unsaturated carboxylic acid, but also a multi-component copolymer where other monomers are copolymerized. The other monomers that may be copolymerized with the ethylene-unsaturated carboxylic acid copolymer include, by way of example, vinyl ester such as vinyl acetate and vinyl propionate, unsaturated carboxylic acid ester such as methyl acrylate, ethyl acrylate, isobutyl acrylate, n-butyl acrylate, methyl methacrylate, isobutyl methacrylate, dimethyl maleate, or diethyl maleate.

According to the present embodiment, the softening point of the thermoplastic resin of the thermoplastic resin block 100 represents a temperature in the range from 0° C. to 300° C. Since the thermoplastic resin of the thermoplastic resin block 100 is selected from the above group of compounds, its softening point falls in the range from 0° C. to 300° C.

The softening point of the thermoplastic resin of the thermoplastic resin block 100 can be adjusted by mixing some of the different compounds described by way of example above. For example, the thermoplastic resin is prevented from becoming softened while the workpiece 1 is being processed in a dry polishing process by adjusting the softening point to a temperature higher than the range from about 40° C. to 100° C. in which the temperature of the workpiece 1 is kept during the dry polishing process.

Figure 7:
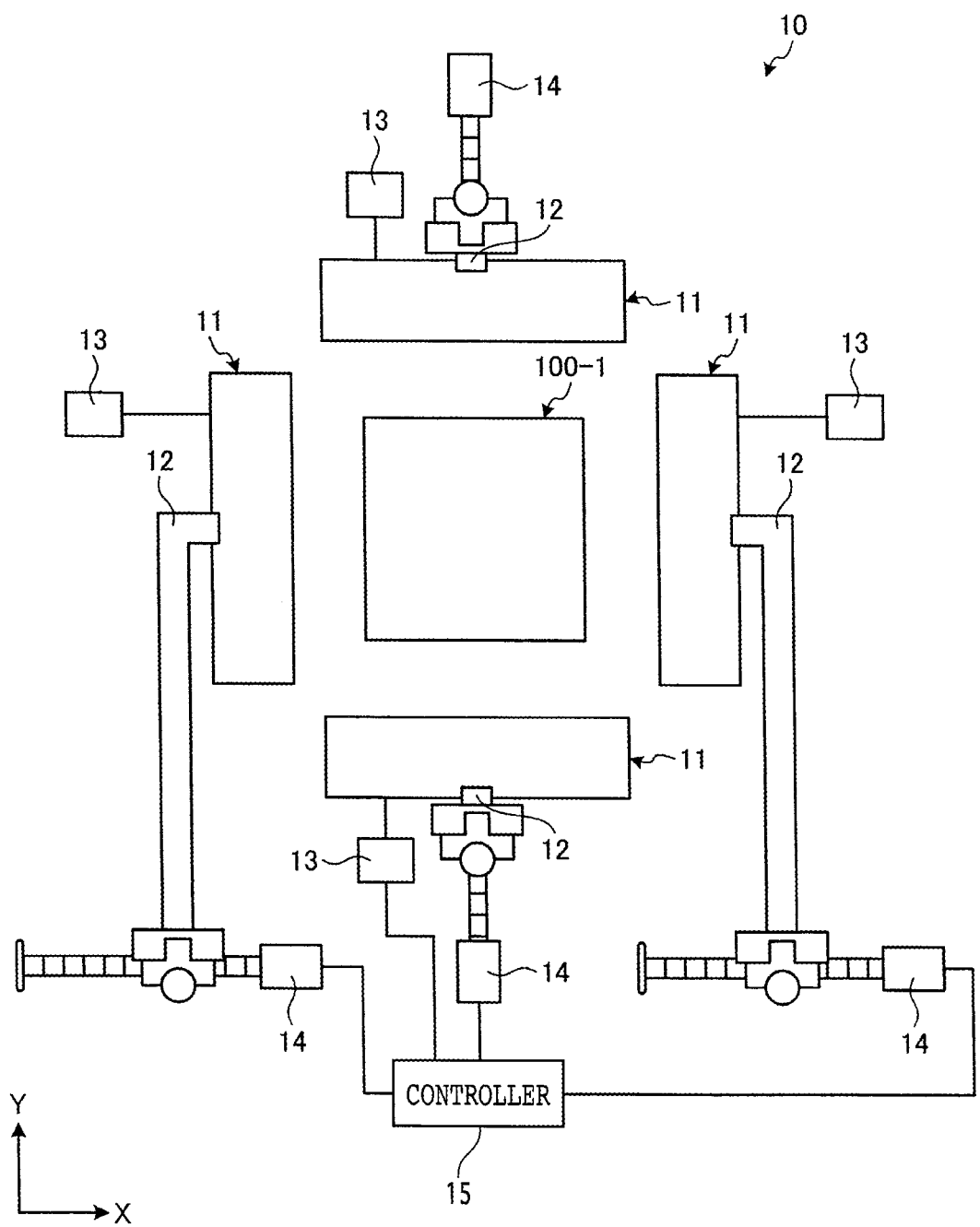
FIG. 7 is a plan view schematically illustrating a structural example of a sheet producing unit used in the sheet producing step illustrated in FIG. 1.
Figure 8:
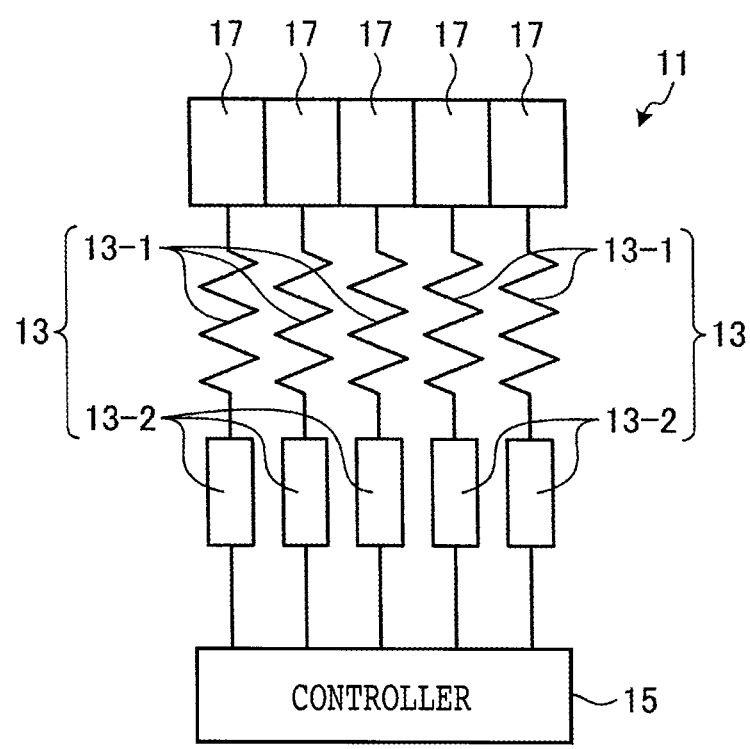
FIG. 8 is a plan view schematically illustrating a portion of the structure of a sheet gripping unit of the sheet producing unit illustrated in FIG. 7.
Figure 9:
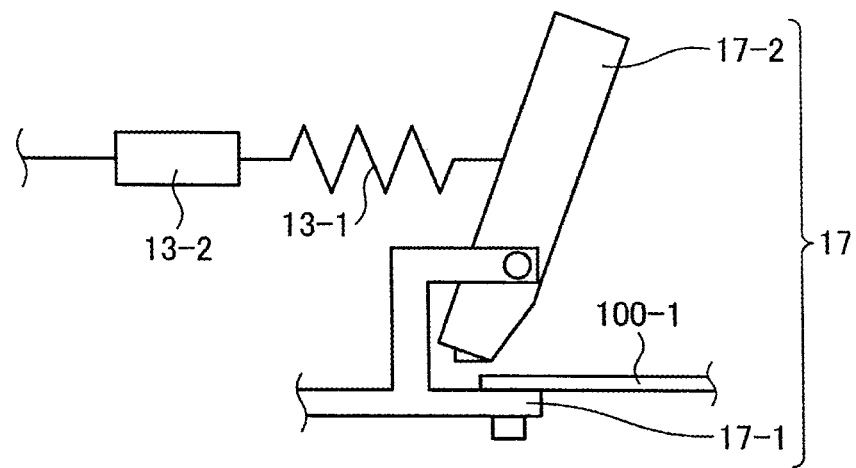
FIG. 9 is a side elevational view schematically illustrating the portion of the structure of the sheet gripping unit of the sheet producing unit illustrated in FIG. 7.
Figure 10:
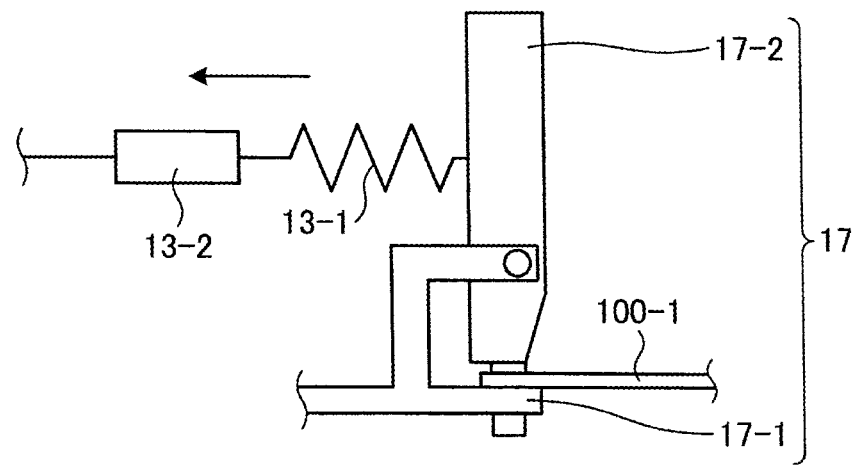
FIG. 10 is a side elevational view schematically illustrating the portion of the structure of the sheet gripping unit of the sheet producing unit illustrated in FIG. 7.
Figure 11:
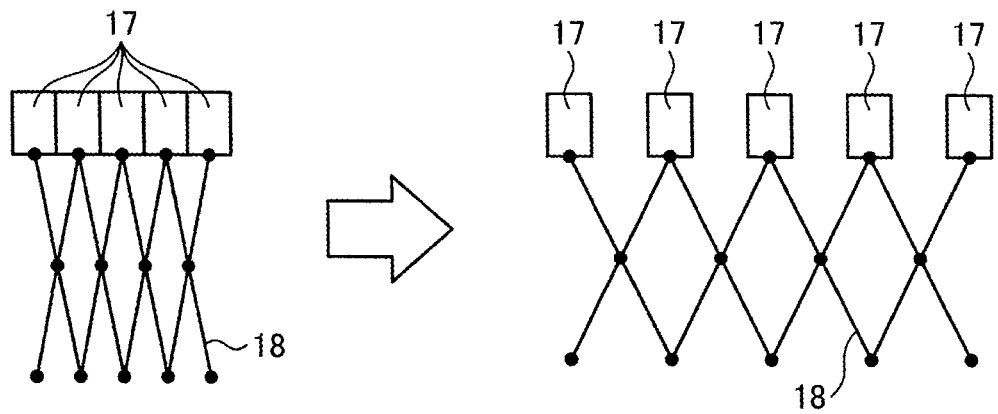
FIG. 11 is a plan view schematically illustrating another portion of the structure of the sheet gripping unit of the sheet producing unit illustrated in FIG. 7.
Figure 12:
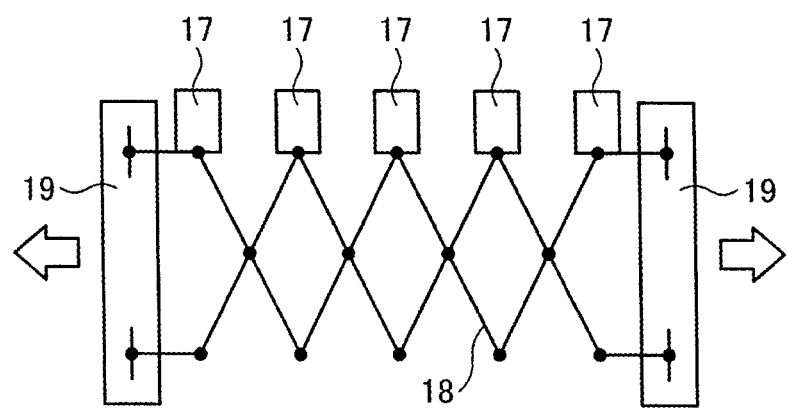
FIG. 12 is a plan view schematically illustrating still another portion of the structure of the sheet gripping unit of the sheet producing unit illustrated in FIG. 7.
Figure 13:
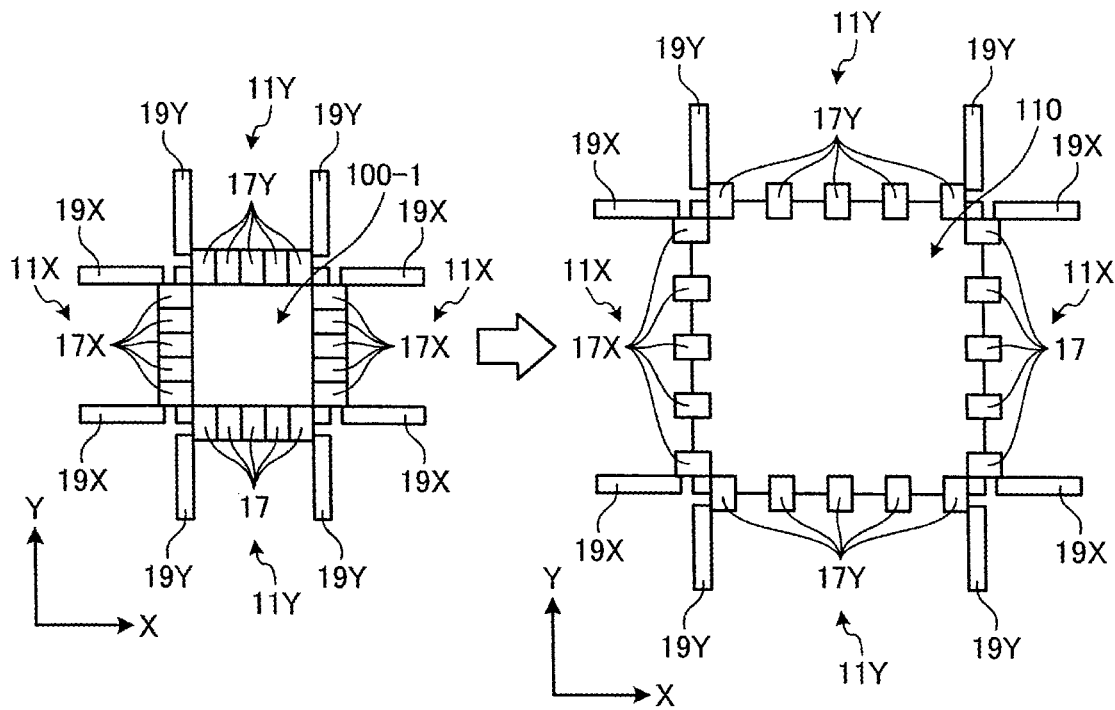
FIG. 13 is a plan view schematically illustrating yet still another portion of the structure of the sheet gripping unit of the sheet producing unit illustrated in FIG. 7.

FIG. 7 schematically illustrates, in plan, a structural example of a sheet producing unit 10 used in the sheet producing step 1001 illustrated in FIG. 1. FIG. 8 schematically illustrates, in plan, a portion of the structure of a sheet gripping unit 11 of the sheet producing unit 10 illustrated in FIG. 7. Each of FIGS. 9 and 10 schematically illustrates, in side elevation, the portion of the structure of the sheet gripping unit 11 of the sheet producing unit 10 illustrated in FIG. 7. Each of FIGS. 11, 12, and 13 schematically illustrates, in plan, another portion of the structure of the sheet gripping unit 11 of the sheet producing unit 10 illustrated in FIG. 7. As illustrated in FIG. 7, the sheet producing unit 10 includes a plurality of (four in FIG. 7) sheet gripping units 11, a plurality of (four in FIG. 7) arm members 12, a plurality of gripper actuators 13, a plurality of (four in FIG. 7) moving units 14, and a controller 15.

According to the present embodiment, the four sheet gripping units 11 are disposed in facing relation to the respective four sides of the square thermoplastic resin block 100-1, for gripping respective outer edges of the four sides of the thermoplastic resin block 100-1. As illustrated in FIG. 7, the square thermoplastic resin block 100-1 has a pair of opposite sides facing each other in X directions, i.e., +X and −X directions, and another pair of opposite sides facing each other in Y directions, i.e., +Y and −Y directions, the X and Y directions extending perpendicularly to each other. According to the present embodiment, the four sheet gripping units 11 grip the respective outer edges of the four sides of the thermoplastic resin block 100-1 in the respective four directions represented by the +X and −X directions and the +Y and −Y directions.

The arm members 12 are combined respectively with the sheet gripping units 11. Specifically, the arm members 12 have ends connected to respective sides of the sheet gripping units 11 that face away from the thermoplastic resin block 100-1 and other ends connected to the respective moving units 14. When the moving units 14 are actuated, the arm members 12 are moved toward and away from the thermoplastic resin block 100-1, thereby moving the sheet gripping units 11 toward and away from the thermoplastic resin block 100-1.

The moving units 14 are combined respectively with the arm members 12. The moving units 14 are connected to the respective other ends of the arm members 12. As described above, when the moving units 14 are actuated, they move the arm members 12 toward and away from the thermoplastic resin block 100-1, thereby moving the sheet gripping units 11 toward and away from the thermoplastic resin block 100-1.

According to the present embodiment, as illustrated in FIG. 8, each of the sheet gripping units 11 includes a plurality of (five in FIG. 8) grippers 17. The grippers 17 are arrayed along one of the sides of the thermoplastic resin block 100-1 and face the side of the thermoplastic resin block 100-1. As illustrated in FIGS. 9 and 10, each of the grippers 17 has a first gripping member 17-1 and a second gripping members 17-2. The first gripping member 17-1 supports the lower surface of the outer edge of the thermoplastic resin block 100-1. The second gripping member 17-2 is attached to the first gripping member 17-1 so as to be movable relatively to the first gripping member 17-1. The second gripping member 17-2 is movable between an open position illustrated in FIG. 9 that is spaced upwardly from the outer edge of the thermoplastic resin block 100-1 that is supported on the first gripping member 17-1 and a gripping position illustrated in FIG. 10 in which the second gripping member 17-2 presses downwardly the outer edge of the thermoplastic resin block 100-1 that is supported on the first gripping member 17-1, gripping the outer edge of the thermoplastic resin block 100-1 between itself and the first gripping member 17-1.

The gripper actuators 13 are combined respectively with the grippers 17 of the sheet gripping units 11. According to the present embodiment, as illustrated in FIGS. 8, 9, and 10, each of the gripper actuators 13 includes a spring member 13-1 and an air cylinder 13-2. The spring member 13-1 has an end connected to the side of one of the second gripping member 17-2 that faces away from the thermoplastic resin block 100-1 and another end connected to an end of the air cylinder 13-2. The air cylinder 13-2 has another end electrically connected to the controller 15. When the air cylinder 13-2 of the gripper actuator 13 does not pull the spring member 13-1, the second gripping member 17-2 is in the open position, placing the gripper 17 in an open state in which the gripper 17 does not grip the outer edge of the thermoplastic resin block 100-1. When the gripper actuator 13 is controlled by the controller 15 to actuate the air cylinder 13-2 to pull the spring member 13-1, the spring member 13-1 moves the second gripping member 17-2 with respect to the first gripping member 17-1 into the gripping position, placing the gripper 17 in a gripping state in which the first gripping member 17-1 and the second gripping member 17-2 grip the outer edge of the thermoplastic resin block 100-1. The gripper 17 thus switches between the gripping state in which it grips the outer edge of the thermoplastic resin block 100-1 and the open state in which the gripper 17 cancels the gripping state, releasing the outer edge of the thermoplastic resin block 100-1. The air cylinders 13-2 may be replaced with electromagnetic actuators for electromagnetically moving the second gripping members 17-2 into the gripping position. The gripper actuators 13 may be modified such that only the air cylinders 13-2 can move the grippers 17 between the open state and the gripping state without the need for the spring members 13-1.

According to the present embodiment, as illustrated in FIGS. 11 and 12, a pantograph mechanism 18 is connected to the grippers 17 of each of the sheet gripping units 11. As illustrated in FIG. 11, the pantograph mechanism 18 is a mechanism for expanding and contracting the sheet gripping unit 11 while keeping the grippers 17 uniformly spaced apart. As illustrated in FIG. 12, a pair of pantograph actuators 19 for actuating the pantograph mechanism 18 are connected respectively to the opposite ends of the sheet gripping unit 11 along the array of the grippers 17.

As illustrated in FIG. 13, the pair of sheet gripping units 11 that face each other in the X directions, the grippers 17 of these sheet gripping units 11, and the pantograph actuators 19 connected to these grippers 17 by the pantograph mechanism 18 will hereinafter be referred to as sheet gripping units 11X, grippers 17X, and pantograph actuators 19X, respectively. Similarly, the pair of sheet gripping units 11 that face each other in the Y directions, the grippers 17 of these sheet gripping units 11, and the pantograph actuators 19 connected to these grippers 17 by the pantograph mechanism 18 will hereinafter be referred to as sheet gripping units 11Y, grippers 17Y, and pantograph actuators 19Y, respectively. According to the present embodiment, the pantograph actuators 19X are also connected to those sheet gripping units 11Y that are closer thereto. As the sheet gripping units 11Y are progressively spread away from each other in the Y directions, they progressively spread the pantograph actuators 19X in the Y directions in unison with the sheet gripping units 11Y, and the pantograph actuators 19X progressively spread the grippers 17X while keeping them uniformly spaced apart in the Y directions. Likewise, the pantograph actuators 19Y are also connected to those sheet gripping units 11X that are closer thereto. As the sheet gripping units 11X are progressively spread away from each other in the X directions, they progressively spread the pantograph actuators 19Y in the X directions in unison with the sheet gripping units 11X, and the pantograph actuators 19Y progressively spread the grippers 17Y while keeping them uniformly spaced apart in the X directions.

The controller 15 controls the gripper actuators 13 and the moving units 14 to enable the sheet producing units 10 to perform the sheet producing step 1001. According to the present embodiment, the controller 15 includes a computer system. The computer system of the controller 15 includes an arithmetic processing device having a microprocessor such as a central processing unit (CPU), a storage device having a memory such as a read only memory (ROM) or a random access memory (RAM), and an input/output interface device. The arithmetic processing device of the controller 15 performs arithmetic processing operations according to computer programs stored in the storage device of the controller 15, and outputs control signals for controlling the sheet producing unit 10 via the input/output interface device to the components of the sheet producing unit 10.

Figure 14:
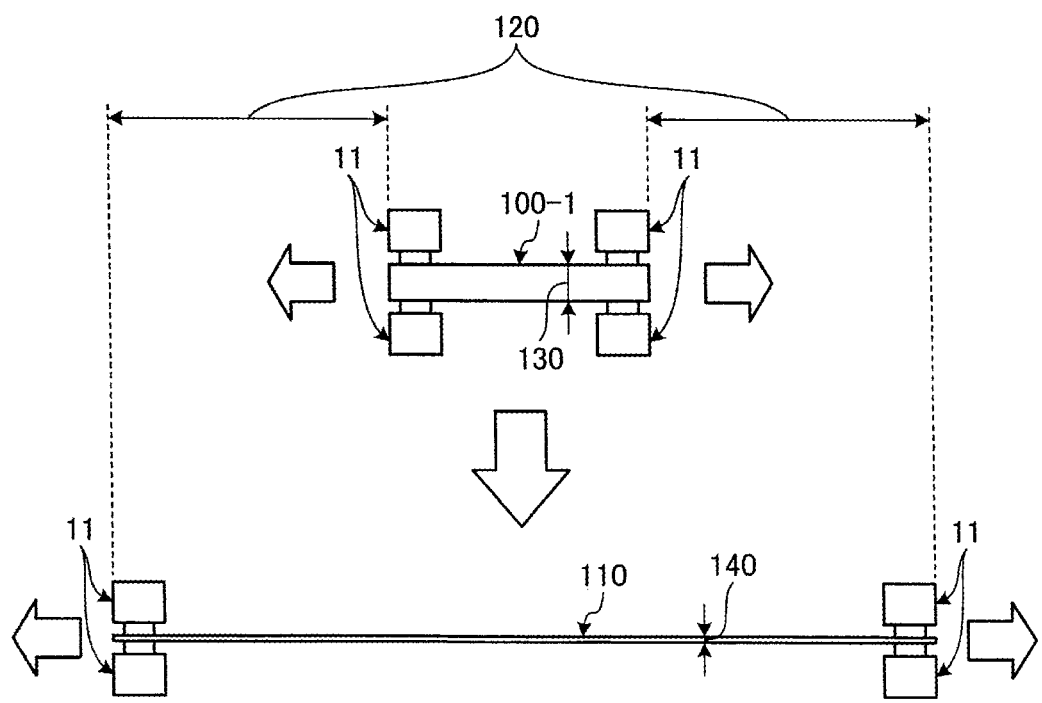
FIG. 14 is a cross-sectional view schematically illustrating the sheet producing step illustrated in FIG. 1 that is carried out by the sheet producing unit illustrated in FIG. 7.

FIG. 14 schematically illustrates the sheet producing step 1001 illustrated in FIG. 1 that is carried out by the sheet producing unit 10 illustrated in FIG. 7. As illustrated in FIGS. 13 and 14, the sheet producing step 1001 is a step of gripping the outer edges of the thermoplastic resin block 100 shaped as a plate of thermoplastic resin and pulling the thermoplastic resin block 100 planewise outwardly in at least the four directions including the +X and −X directions and the +Y and −Y directions while heating the thermoplastic resin block 100 to soften or melt the same, thereby producing the sheet-like protective member 110.

In the sheet producing step 1001, the controller 15 first controls the grippers 17 of the sheet gripping units 11 to grip the outer edges of the sides of the thermoplastic resin block 100-1 that are disposed in facing relation to the respective sheet gripping units 11. Specifically, the controller 15 controls the gripper actuators 13 to keep the grippers 17 of the sheet gripping units 11 in the open state and also controls the moving units 14 to move the grippers 17 of the sheet gripping units 11 toward the thermoplastic resin block 100-1 until the grippers 17 contact the thermoplastic resin block 100-1. Then, the controller 15 controls the gripper actuators 13 to cause the sheet gripping units 11 to switch into the gripping state, enabling the grippers 17 to grip the outer edges of the sides of the thermoplastic resin block 100-1.

In the sheet producing step 1001, when the sheet gripping units 11 grip the outer edges of the sides of the thermoplastic resin block 100-1, for example, a support table or the like, not illustrated, that has supported the thermoplastic resin block 100-1 before the sheet gripping units 11 grip the thermoplastic resin block 100-1 is taken away, leaving most of the thermoplastic resin block 100-1 except its portions gripped by the sheet gripping units 11 floating in the air out of contact with anything solid.

In the sheet producing step 1001, after the sheet gripping units 11 have gripped the outer edges of the sides of the thermoplastic resin block 100-1, a heating unit, not illustrated, is energized to heat the thermoplastic resin block 100-1 whose outer edges are gripped by the sheet gripping units 11 to a temperature equal to or higher than the softening point of the thermoplastic resin of the thermoplastic resin block 100-1, so that the thermoplastic resin block 100-1 is softened or melted. For example, a hot air blowing unit, not illustrated, may apply hot air to the thermoplastic resin block 100-1 in any of its planewise directions to heat the thermoplastic resin block 100-1. Alternatively, the thermoplastic resin block 100-1 and the sheet gripping units 11 that grip the thermoplastic resin block 100-1 may be placed in a heating furnace, not illustrated, and the heating furnace may heat the space therein to heat the thermoplastic resin block 100-1.

In the sheet producing step 1001, while the thermoplastic resin block 100-1 whose outer edges are gripped by the sheet gripping units 11 is being heated, softened, or melted, the controller 15 moves the sheet gripping units 11 that grip the outer edges of the sides of the thermoplastic resin block 100-1 in directions away from the thermoplastic resin block 100-1, thereby causing the sheet gripping units 11 to stretch the thermoplastic resin block 100-1 outwardly planewise into the sheet-like protective member 110. Specifically, according to the present embodiment, in the sheet producing step 1001, the sheet gripping units 11 stretch the thermoplastic resin block 100-1 in the four directions including +X and −X directions and the +Y and −Y directions, producing the sheet-like protective member 110.

In the sheet producing step 1001, the thermoplastic resin block 100-1 can be stretched uniformly planewise by being pulled outwardly in the four directions. The thermoplastic resin block 100-1 thus stretched uniformly planewise ensures that the resultant protective member 110 has a highly accurate thickness 140. The highly accurate thickness 140 means that the thickness 140 of the protective member 110 is closer to a desired value and more uniform throughout the protective member 110.

According to the present embodiment, in the sheet producing step 1001, the controller 15 further moves the sheet gripping units 11 in directions away from the thermoplastic resin block 100-1, as illustrated in FIG. 13, thereby spacing the pantograph actuators 19 apart to spread the grippers 17 apart as the thermoplastic resin block 100-1 is stretched planewise while keeping the grippers 17 uniformly spaced apart. Specifically, according to the present embodiment, in the sheet producing step 1001, the controller 15 spaces the paired pantograph actuators 19 away from each other at the same speed as the speed at which the mutually facing the sheet gripping units 11 are spaced away from each other, thereby spreading the grippers 17 apart as the thermoplastic resin block 100-1 is stretched planewise. According to the present embodiment, in the sheet producing step 1001, therefore, the grippers 17 of the sheet gripping units 11 are capable of stretching the thermoplastic resin block 100-1 more uniformly planewise in its entirety including the four corners thereof. The resultant protective member 110 is thus prevented from being unduly wrinkled and has the accuracy of the thickness 140 further increased.

According to the present embodiment, in the sheet producing step 1001, the thermoplastic resin block 100-1 whose outer edges are gripped may be pulled and stretched simultaneously in the +X and −X directions and the +Y and −Y directions among at least the four directions or may be pulled and stretched first in one of the directions and then in the remaining directions among at least the four directions. In the sheet producing step 1001, moreover, the thermoplastic resin block 100-1 may be pulled a distance in the +X and −X directions and a different distance in the +Y and −Y directions. In the sheet producing step 1001, for stretching the square thermoplastic resin block 100-1 into the square sheet-like protective member 110, for example, the square thermoplastic resin block 100-1 is pulled and stretched simultaneously in the +X and −X directions and the +Y and −Y directions. For stretching the square thermoplastic resin block 100-1 into an oblong rectangular sheet-like protective member 110 that matches the workpiece 1-2 illustrated in FIGS. 3 and 4, for example, the square thermoplastic resin block 100-1 may be pulled a larger distance in either one of the directions than that in the remaining directions.

In the sheet producing step 1001, further, the controller 15 controls a pulled distance 120 illustrated in FIG. 14 to control the thickness 140 of the resultant sheet-like protective member 110. The pulled distance 120 refers to a total of two kinds of length illustrated in FIG. 14, and represents an interval between the sheet gripping units 11 that face each other when they have spread the square thermoplastic resin block 100-1 into the sheet-like protective member 110, exclusive of the distance between the sheet gripping units 11 prior to pulling the thermoplastic resin block 100-1. Specifically, in the sheet producing step 1001, the controller 15 refers to a database representing a correlative relation of the thickness 130 of the thermoplastic resin block 100-1, the pulled distance 120, and the thickness 140 of the resultant sheet-like protective member 110, and calculates a desired pulled distance 120 on the basis of the thickness 130 of the thermoplastic resin block 100-1 and a desired thickness 140 for the sheet-like protective member 110 to be produced. In the sheet producing step 1001, the longer the pulled distance 120 is, the smaller the thickness 140 of the resultant sheet-like protective member 110 is, and the square of the pulled distance 120 and the thickness 140 of the resultant sheet-like protective member 110 are generally inversely proportional to each other, for example. In the sheet producing step 1001, the controller 15 then moves the confronting sheet gripping units 11 away from each other according to the calculated desired pulled distance 120, thereby producing the sheet-like protective member 110 having the desired thickness 140 by controlling the actual pulled distance 120.

Figure 15:
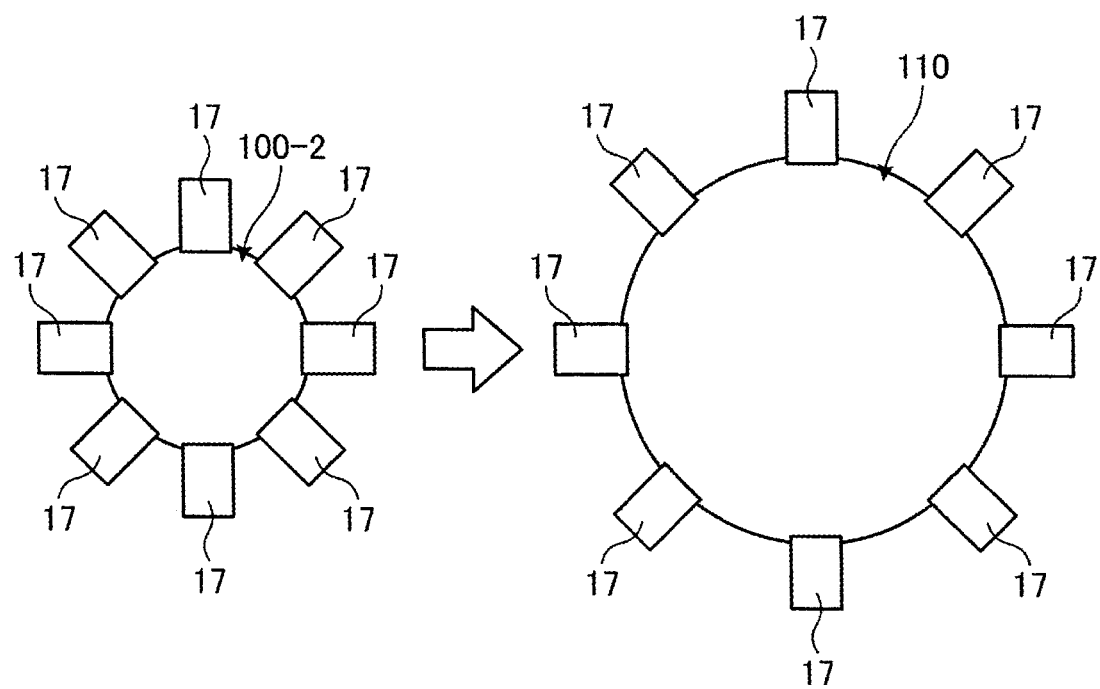
FIG. 15 is a plan view schematically illustrating another example of the sheet producing step illustrated in FIG. 1.

FIG. 15 schematically illustrates, in plan, another example of the sheet producing step 1001 illustrated in FIG. 1. According to the above embodiment, in the sheet producing step 1001, the grippers 17 grip the outer edges of the four sides of the thermoplastic resin block 100-1 are gripped and pull the outer edges in directions away from the thermoplastic resin block 100-1, thereby producing the square or oblong rectangular sheet-like protective member 110. However, the present invention is not limited to the above embodiment. The outer edges of at least four sides of a thermoplastic resin block 100-2 (see FIG. 15) may be pulled in radial directions away from the thermoplastic resin block 100-2, thereby producing a sheet-like protective member 110, for example. Specifically, in the sheet producing step 1001, as illustrated in FIG. 15, eight or more grippers 17 (eight in FIG. 15), for example, disposed radially around the thermoplastic resin block 100-2 and gripper actuators combined therewith pull the outer edges of the thermoplastic resin block 100-2 in radial directions away from the thermoplastic resin block 100-2, thereby producing a circular sheet-like protective member 110.

The integrating step 1002 is a step, after the sheet producing step 1001, of heating and bringing the sheet-like protective member 110 into intimate contact with the workpiece 1, thereby integrating the workpiece 1 and the protective member 110 with each other. Specifically, in the integrating step 1002, while the sheet-like protective member 110 produced in the sheet producing step 1001 is continuously being gripped by the sheet gripping units 11, the controller 15 moves the workpiece 1 held on a holding surface 21 (see FIGS. 16 and 17) of a holding table 20 to a position beneath the protective member 110 gripped by the sheet gripping units 11 and places the workpiece 1 in that position, and holds the protective member 110 and the face side 4 of the workpiece 1 in facing relation to each other. Thereafter, the controller 15 controls heating means 22 (see FIGS. 16 and 17) housed in the holding table 20 to heat the protective member 110 from the holding surface 21 through the workpiece 1 to a predetermined temperature of 150° C. or higher, for example, and brings the protective member 110 into intimate contact with the face side 4 of the workpiece 1, thereby integrating the protective member 110 and the workpiece 1 with each other. According to the present invention, the protective member 110 may not necessarily be heated by the heating means 22 in the integrating step 1002. Instead, the protective member 110 may be heated by a hot air blowing unit, a heating furnace, or the like, not illustrated, as is the case with the sheet producing step 1001. Further alternatively, the integrating step 1002 may take over once the protective member 110 that has been heated is cooled down to a temperature optimum for being affixed to the workpiece 1 in the sheet producing step 1001.

Figure 16:
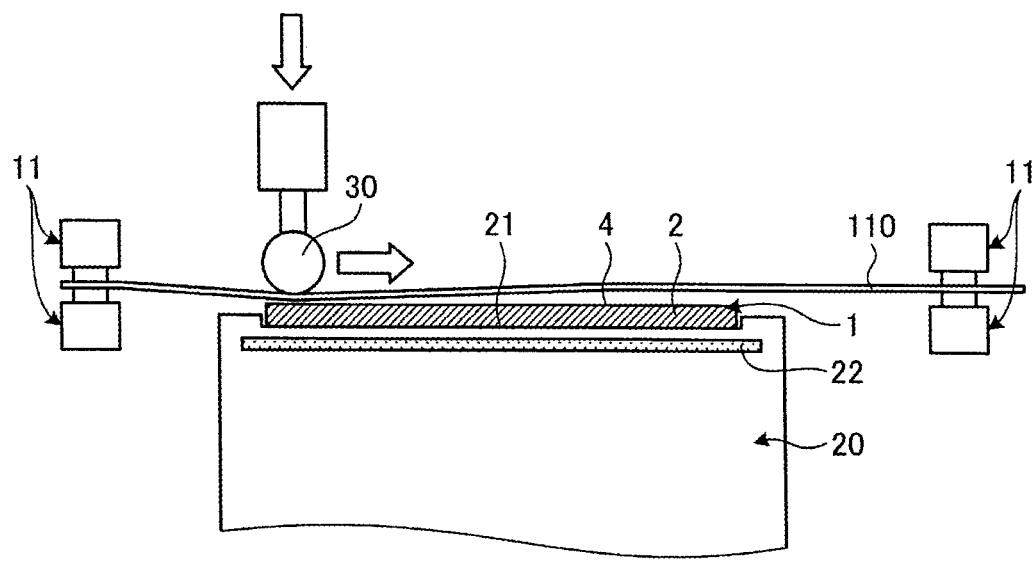
FIG. 16 is a cross-sectional view illustrating an example of the integrating step illustrated in FIG. 1.

FIG. 16 illustrates, in cross section, an example of the integrating step 1002 illustrated in FIG. 1. In the example of the integrating step 1002 illustrated in FIG. 16, after the protective member 110 and the workpiece 1 held on the holding surface 21 of the holding table 20 have been brought into facing relation to each other, while the protective member 110 is being heated by the heating means 22, a pressing roller 30 presses the protective member 110 against the face side 4 of the workpiece 1 and rotationally moves on the protective member 110 from one end of the face side 4 of the workpiece 1 toward the other end thereof, thereby bringing the protective member 110 into intimate contact with the face side 4 of the workpiece 1.

Figure 17:
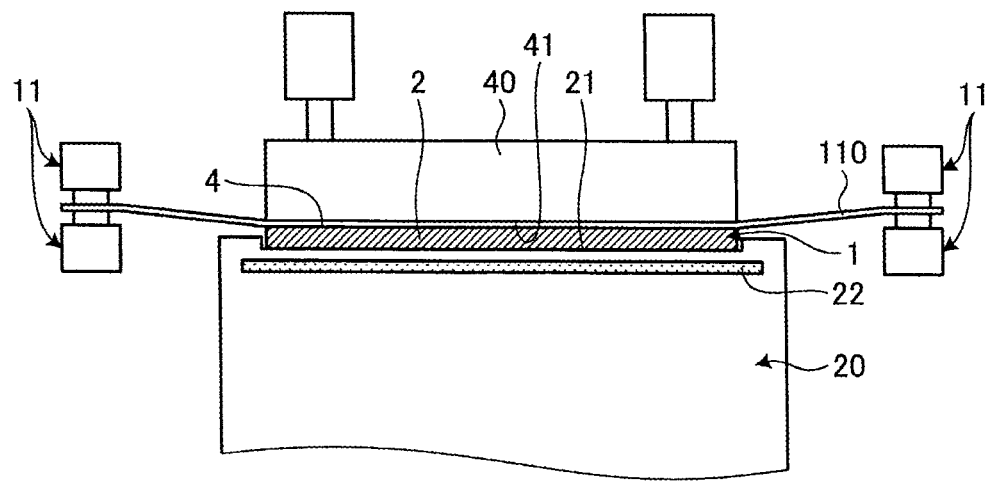
FIG. 17 is a cross-sectional view illustrating another example of the integrating step illustrated in FIG. 1.

FIG. 17 illustrates, in cross section, another example of the integrating step 1002 illustrated in FIG. 1. In the example of the integrating step 1002 illustrated in FIG. 17, after the protective member 110 and the workpiece 1 held on the holding surface 21 of the holding table 20 have been brought into facing relation to each other, while the protective member 110 is being heated by the heating means 22, a flat pressing surface 41 of a pressing member 40 that lies parallel to the holding surface 21 presses the protective member 110 against the face side 4 of the workpiece 1 with a predetermined pressing force of 0.3 Mpa or higher, for example, for a predetermined time of 30 seconds or longer, for example, thereby bringing the protective member 110 into intimate contact with the face side 4 of the workpiece 1.

Alternatively, in the integrating step 1002, the protective member 110 may be integrated with the workpiece 1 by a vacuum mounting device rather than the pressing roller 30 or the pressing member 40. Specifically, the vacuum mounting device operates in the integrating step 1002 as follows. The protective member 110, the sheet gripping units 11 gripping the protective member 110, the workpiece 1, and the holding table 20 holding and heating the workpiece 1 are put into a vacuum chamber, not illustrated. While the protective member 110 and the face side 4 of the workpiece 1 are being spaced from each other by a predetermined distance, the vacuum chamber is evacuated. Thereafter, a gas is introduced into an area in the vacuum chamber on one side of the protective member 110 opposite the workpiece 1, bringing the protective member 110 into intimate contact with the face side 4 of the workpiece 1 under a pressure difference developed across the protective member 110.

Further alternatively, in the integrating step 1002, after the protective member 110 has been placed on the face side 4 of the workpiece 1, an industrial drier, not illustrated, may blow hot air at a predetermined temperature of 150° C. or higher to the protective member 110 to heat and soften the protective member 110, thereby bringing the protective member 110 into intimate contact with the face side 4 of the workpiece 1.

In the integrating step 1002, according to the present embodiment, the protective member 110 and the workpiece 1 are integrated with each other by bringing the protective member 110 into intimate contact with the workpiece 1. The present invention is not limited to such details. The protective member 110 and an annular frame that accommodates the workpiece 1 therein may be brought into intimate contact with each other, thereby integrating the protective member 110 with the workpiece 1 along with the annular frame. The annular frame is plate-shaped and has a circular opening defined centrally therein that is larger in diameter than the workpiece 1. The annular frame is made of a metal material such as steel use stainless (SUS), or resin. In the integrating step 1002, the annular frame is placed on the holding table 20, for example, in surrounding relation to the outer circumference of the workpiece 1, and holds and supports the workpiece 1 in the opening with the protective member 110 interposed therebetween when the annular frame is integrated with the protective member 110 and the workpiece 1.

Figure 18:
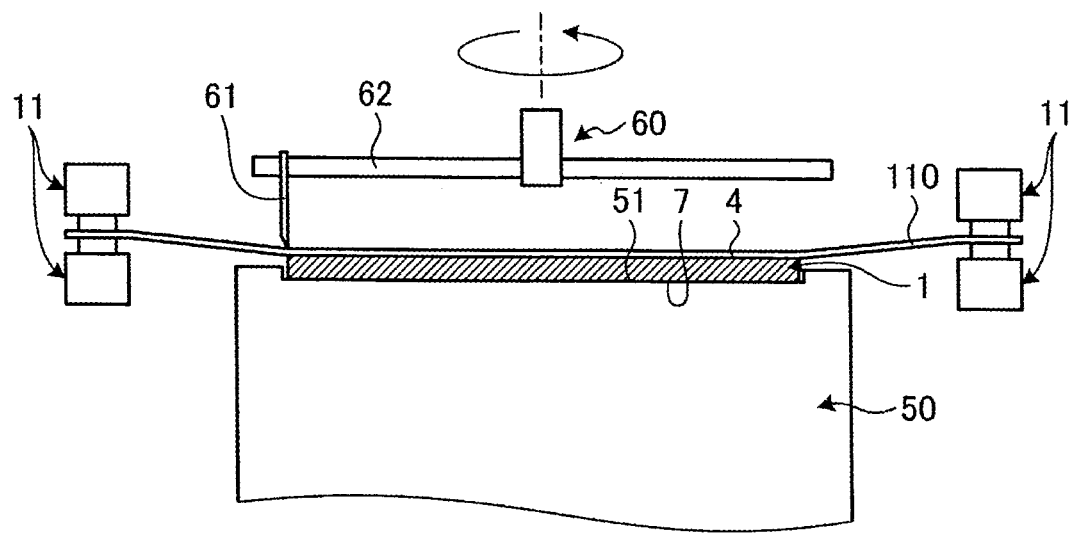
FIG. 18 is a cross-sectional view illustrating an example of an excessive area cutting-off process of the integrating step illustrated in FIG. 1.

FIG. 18 illustrates, in cross section, an example of an excessive area cutting-off process of the integrating step 1002 illustrated in FIG. 1. According to the present embodiment, after the workpiece 1 and the protective member 110 have been integrated with each other, the excessive area cutting-off process is carried out to cut off an excessive area that protrudes from the outer edge of the workpiece 1.

In the excessive area cutting-off process, as illustrated in FIG. 18, the reverse side 7 of the workpiece 1 that has been integrated with the protective member 110 in intimate contact therewith is held on a holding surface 51 of a holding table 50, and the cutting edge of a cutter 61 of a cutting-off device 60 is caused to cut into the protective member 110 along the outer edge of the workpiece 1 from opposite the holding table 50. A rotary actuator, not illustrated, rotates a circular plate 62 that holds the cutter 61 about its central axis to move the cutter 61 along the outer edge of the workpiece 1, thereby cutting off the excessive area of the protective member 110 integrated with the workpiece 1 in intimate contact therewith. In this fashion, the workpiece 1 with the protective member 110 placed on the face side 4 thereof is obtained.

Figure 19:
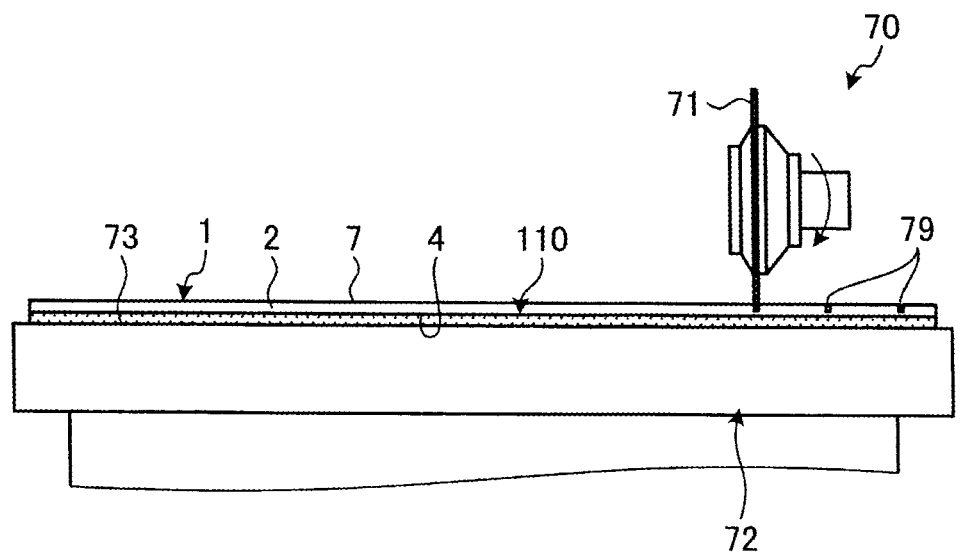
FIG. 19 is a cross-sectional view illustrating an example of a process of processing the workpiece on which the protective member is placed by the method of placing a protective member illustrated in FIG. 1.
Figure 20:
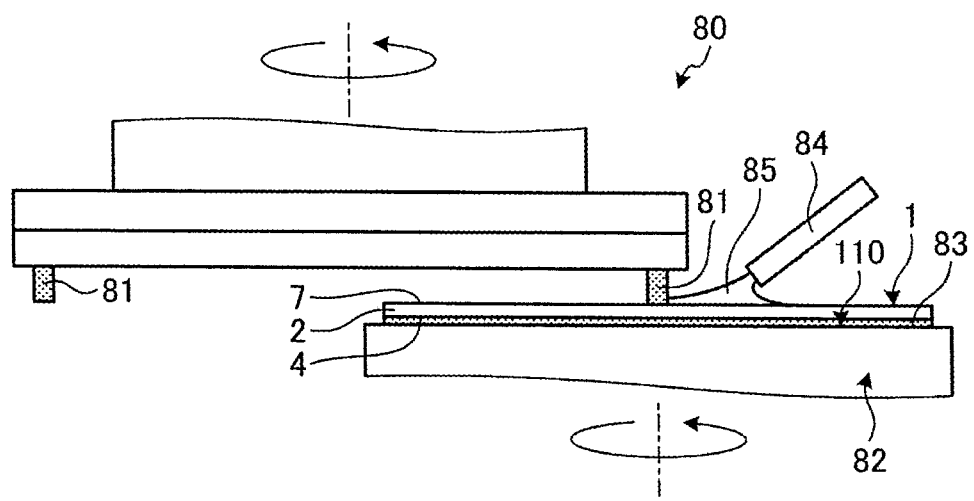
FIG. 20 is a cross-sectional view illustrating another example of the process of processing the workpiece on which the protective member is placed by the method of placing a protective member illustrated in FIG. 1.
Figure 21:
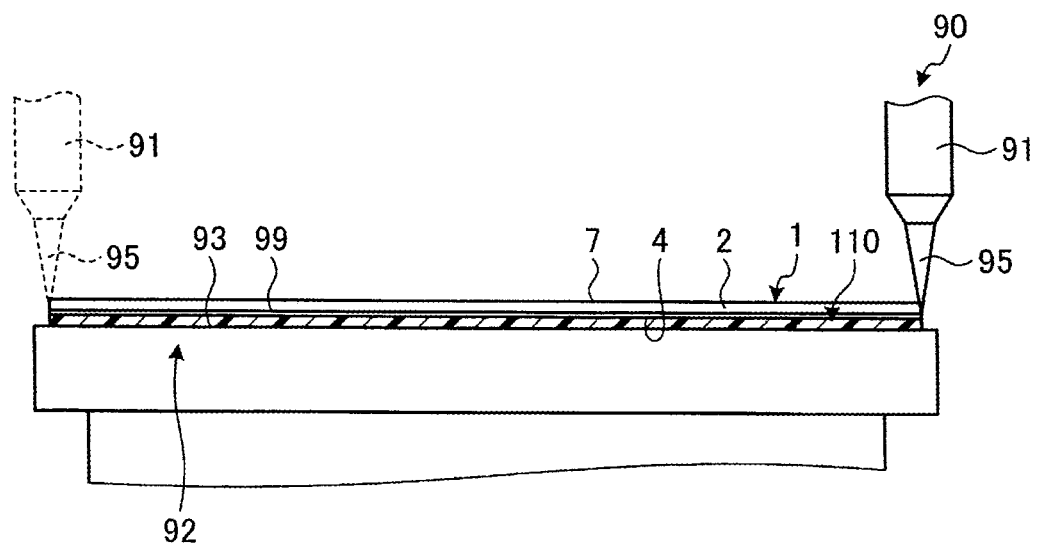
FIG. 21 is a cross-sectional view illustrating still another example of the process of processing the workpiece on which the protective member is placed by the method of placing a protective member illustrated in FIG. 1.

A process of processing the workpiece 1 on which the protective member 110 has been placed thereon by the method of placing a protective member according to the present embodiment will be described below. FIGS. 19, 20, and 21 illustrate, in cross section, examples of the process of processing the workpiece 1 on which the protective member 110 has been placed by the method of placing a protective member illustrated in FIG. 1.

In the example of the process of processing the workpiece 1 illustrated in FIG. 19, a holding surface 73 of a chuck table 72 of a cutting apparatus 70 holds the workpiece 1 under suction thereon with the protective member 110 interposed therebetween, and while a cutting fluid is being supplied to the exposed reverse side 7 of the workpiece 1, a cutting blade 71 mounted on a spindle of a cutting apparatus 70 is rotated about its central axis, and an actuator, not illustrated, moves the cutting blade 71 relatively to the workpiece 1 on the chuck table 72 to cut the workpiece 1 from the reverse side 7 thereof with the cutting blade 71.

In the example of the process of processing the workpiece 1 illustrated in FIG. 20, a holding surface 83 of a chuck table 82 of a grinding apparatus 80 holds the workpiece 1 under suction thereon with the protective member 110 interposed therebetween, and while a grinding fluid supply unit 84 is supplying a grinding fluid 85 to the exposed reverse side 7 of the workpiece 1, a grinding wheel mounted on a spindle of a grinding apparatus 80 is rotated about its central axis, and an actuator, not illustrated, presses an annular array of grindstones 81 mounted on a surface of the grinding wheel against the workpiece 1 on the chuck table 72 to grind the workpiece 1 from the reverse side 7 thereof with the grindstones 81. In this process of processing the workpiece 1, the reverse side 7 of the workpiece 1 may be ground flatwise, or what is called a TAIKO (registered trademark) grinding process may be performed to thin down the workpiece 1 by grinding only an inner circumferential area of the workpiece 1, leaving an outermost circumferential side edge portion thereof unground.

In the example of the process of processing the workpiece 1 illustrated in FIG. 21, a holding surface 93 of a chuck table 92 of a laser processing apparatus 90 holds the workpiece 1 under suction thereon with the protective member 110 interposed therebetween, and while a laser irradiator 91 of the laser processing apparatus 90 is irradiating the workpiece 1 with a laser beam 95, an actuator, not illustrated, moves the laser irradiator 91 relatively to the workpiece 1 on the chuck table 92 to process the workpiece 1 with the laser beam 95 from the reverse side 7 thereof. In this process of processing the workpiece 1, what is called an ablation process may be performed to sublimate or evaporate the workpiece 1 with the laser beam 95 whose wavelength is absorbable by the workpiece 1, or a modified-layer producing process may be performed to produce modified layers in the workpiece 1 with the laser beam 95 whose wavelength is transmittable through the workpiece 1.

Heretofore, inasmuch as it has been customary to heat a thermoplastic resin supplied to a support table and press and spread the thermoplastic resin with a pressing member to form a sheet-like protective member, the support table, the pressing member, and the protective member are liable to stick together after the protective member has been produced, and it is tedious and time-consuming to peel off the protective member from the support table and the pressing member. In the method of placing a protective member according to the embodiment that is arranged as described above, since the outer edges of the thermoplastic resin block 100-1 are gripped and pulled and stretched in at least the four directions into the sheet-like protective member 110 while the plate-shaped thermoplastic resin block 100-1 is being heated and softened or melted, the protective member 110 at the time it is produced is not strongly pressed against the support table or the pressing member. Therefore, the support table, the pressing member, and the protective member 110 are not likely to stick together, and hence it is less tedious and time-consuming to peel off the protective member 110 from the support table and the pressing member, and the adverse effects of heat and thermal expansion of the pressing member on the protective member 110 are reduced.

In addition, as it is not necessary to peel off the protective member 110 from the support table and the pressing member in the method of placing a protective member according to the embodiment, foreign matter is less liable to be trapped in the protective member 110. Further, in the method of placing a protective member according to the embodiment, the accuracy of the thickness 140 of the protective member 110 is increased because the adverse effects of heat and thermal expansion of the pressing member on the protective member 110 are reduced.

In the method of placing a protective member according to the embodiment, since the thickness 140 of the protective member 110 is adjusted by controlling the pulled distance 120, it is possible to obtain the protective member 110 having a desired thickness 140 that is higher in accuracy.

Figure 22:
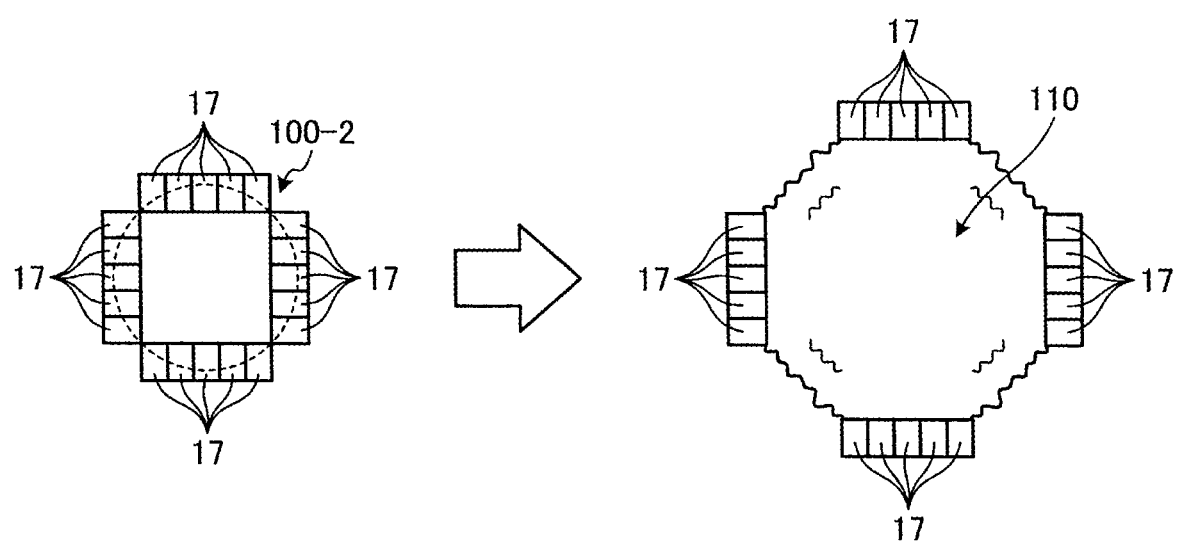
FIG. 22 is a plan view schematically illustrating a sheet producing step of a method of placing a protective member according to a modification.

A method of placing a protective member according to a modification of the present invention will be described below with reference to the drawings. FIG. 22 schematically illustrates, in plan, the sheet producing step 1001 of the method of placing a protective member according to the modification. Those parts in FIG. 22 that are identical to those according to the above embodiment are denoted by identical reference characters, and will be omitted from description.

The method of placing a protective member according to the modification includes the sheet producing step 1001 that is different from the sheet producing step 1001 according to the above embodiment. In the sheet producing step 1001 according to the modification, the thermoplastic resin block 100-2 (see FIG. 6) is to be pulled and stretched, and the sheet gripping units 11 pull the thermoplastic resin block 100-2 in a manner different from the above embodiment. Specifically, in the sheet producing step 1001 according to the modification, as illustrated in FIG. 22, the controller 15 moves the sheet gripping units 11 in directions away from the thermoplastic resin block 100-2 while, at the same time, keeping the pantograph mechanisms 18 and the pairs of pantograph actuators 19 at rest.

In the method of placing a protective member according to the modification, therefore, as the pantograph mechanisms 18 and the pairs of pantograph actuators 19 are not operated and hence required, the sheet producing units 10 can be rendered simpler in structure. In the method of placing a protective member according to the modification, further, since the grippers 17 are not spaced apart as the thermoplastic resin block 100-2 is progressively stretched, the sheet-like protective member 110, i.e., the thermoplastic resin block 100-2, may be likely to develop wrinkles at the four corners thereof. However, the thickness 140 of the sheet-like protective member 110 has a sufficiently high level of accuracy in a central region thereof. Consequently, providing the four corners of the sheet-like protective member 110 belong to the excessive area to be cut off in the excessive area cutting-off process of the integrating step 1002, the adverse effect that the wrinkles developed in the four corners have on the quality of the protective member 110 is low enough to allow the sheet producing step 1001 according to the modification to be carried out appropriately.

The present invention is not limited to the embodiment and modifications described above. Various changes and modifications may be made therein without departing from the scope of the invention. For example, the thermoplastic resin used in the above embodiment and modifications may be colored in a dark color such as black for the purposes of protecting circuits from ultraviolet rays and concealing circuits from view, or may be mixed with an ultraviolet absorbent.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of placing a protective member on a semiconductor wafer, comprising:
   a sheet producing step of heating a plate-shaped thermoplastic resin to soften or melt the plate-shaped thermoplastic resin while gripping, with a plurality of grippers, and pulling outer edges of the thermoplastic resin in at least four directions within a plane which is parallel to a face side of the semiconductor wafer to produce a sheet-like protective member; and
   after the sheet producing step, an integrating step of heating and bringing the sheet-like protective member into intimate contact with the semiconductor wafer to integrate the semiconductor wafer and the protective member with each other.

2. The method of placing a protective member on the semiconductor wafer according to claim 1, wherein the sheet producing step includes a step of adjusting a thickness of the protective member by controlling a pulled distance by which the outer edges of the thermoplastic resin are pulled.

3. The method of placing a protective member on the semiconductor wafer according to claim 1, wherein each of the plurality of grippers has a first gripping member which supports a lower surface of the outer edge of the thermoplastic resin and a second gripping member which is attached to the first gripping member so as to be movable relatively to the first gripping member.

4. The method of placing a protective member on the semiconductor wafer according to claim 3, wherein the second gripping member is movable between an open position that is spaced upwardly from the outer edge of the thermoplastic resin and a gripping position in which the second gripping member presses downwardly on the outer edge of the thermoplastic resin, thereby gripping the outer edge of the thermoplastic resin between the second gripping member and the first gripping member.

5. The method of placing a protective member on the semiconductor wafer according to claim 4, wherein each of the plurality of grippers includes a gripper actuator which causes the gripper to move between the open position and the gripping position, the gripper actuator including an air cylinder which moves the second gripping member.

6. The method of placing a protective member on the semiconductor wafer according to claim 5, wherein the gripper actuator includes a spring disposed between the air cylinder and the second gripping member.

7. The method of placing a protective member on the semiconductor wafer according to claim 1, wherein a pantograph mechanism is connected to the grippers for expanding and contracting the grippers while keeping the grippers uniformly spaced apart.

8. The method of placing a protective member on the semiconductor wafer according to claim 7, wherein a pair of pantograph actuators are disposed on opposite sides of the pantograph mechanism for actuating the pantograph mechanism.

9. The method of placing a protective member on the semiconductor wafer according to claim 1, wherein the grippers are not spaced apart as the thermoplastic resin is pulled.

* * * * *